(12) United States Patent
Nag (10) Patent No.: US 8,690,631 B2
(45) Date of Patent: Apr. 8, 2014

(54) TOY BUILDING BLOCK WITH EMBEDDED INTEGRATED CIRCUIT

(75) Inventor: Debasish Nag, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 67 days.

(21) Appl. No.: 12/749,127

(22) Filed: Mar. 29, 2010

(65) Prior Publication Data

US 2011/0021107 A1    Jan. 27, 2011

Related U.S. Application Data

(63) Continuation-in-part of application No. 12/558,350, filed on Sep. 11, 2009, now abandoned.

(60) Provisional application No. 61/096,667, filed on Sep. 12, 2008.

(51) Int. Cl.
    *A63H 33/04*    (2006.01)

(52) U.S. Cl.
    USPC .............. 446/91; 446/125; 446/128; 446/484

(58) Field of Classification Search
    USPC .............................. 446/91, 118, 124–125.484
    See application file for complete search history.

(56) References Cited

U.S. PATENT DOCUMENTS

| | | | |
|---|---|---|---|
| 3,005,282 A | 10/1961 | Christiansen | |
| 3,346,775 A | 10/1967 | Christiansen | |
| 4,552,541 A | 11/1985 | Bolli | |
| 4,556,393 A | 12/1985 | Bolli | |
| 4,743,202 A | 5/1988 | Bach | |
| 4,883,440 A | 11/1989 | Bolli | |
| 5,042,972 A | 8/1991 | Bach et al. | |
| 5,596,181 A | 1/1997 | Bach et al. | |
| 6,443,796 B1 * | 9/2002 | Shackelford | 446/91 |
| 6,526,375 B1 * | 2/2003 | Frankel et al. | 703/21 |
| 6,547,624 B1 | 4/2003 | Bojesen et al. | |
| 6,585,553 B1 * | 7/2003 | Fetridge et al. | 446/91 |
| 6,645,033 B1 | 11/2003 | Thomsen | |
| 6,733,360 B2 | 5/2004 | Dooley et al. | |
| 6,805,605 B2 * | 10/2004 | Reining et al. | 446/91 |
| 6,902,461 B1 | 6/2005 | Munch et al. | |
| 7,092,899 B2 | 8/2006 | Simas et al. | |
| 7,108,577 B2 | 9/2006 | Peters et al. | |
| 7,166,011 B2 | 1/2007 | Schneck et al. | |

(Continued)

OTHER PUBLICATIONS

Leopardboard 365/355 descriptions, www.leopardboard.org, Mar. 24, 2010.

*Primary Examiner* — William Brewster
*Assistant Examiner* — Alex F. R. P. Rada, II
(74) *Attorney, Agent, or Firm* — Warren L. Franz; Wade J. Brady, III; Frederick J. Telecky, Jr.

(57) ABSTRACT

A toy building block of a type which may be interconnected with similarly configured blocks has a hollow box-shaped structure having a top with cylindrical stud coupling members, and sides which together with the top define a downwardly opening cavity into which the cylindrical studs of a like configured block may be inserted for frictional interconnection. One or more integrated circuit chips are embedded within the molding material of the block, and leads incorporated within the block studs and sides provide electrical interconnection between blocks when like configured blocks are brought into frictional interengagement. In a described embodiment, components of a digital video recording system are apportioned to different blocks which when interconnected provide the complete system functionality.

10 Claims, 9 Drawing Sheets

(56) References Cited

U.S. PATENT DOCUMENTS

| | | | |
|---|---|---|---|
| 7,316,567 B2 * | 1/2008 | Hsieh et al. | 434/171 |
| 7,329,166 B2 | 2/2008 | Hatting et al. | |
| 7,708,615 B2 * | 5/2010 | Munch | 446/91 |
| 7,942,717 B2 * | 5/2011 | Chou | 446/91 |
| 2002/0196250 A1 * | 12/2002 | Anderson et al. | 345/420 |
| 2005/0026537 A1 * | 2/2005 | Hsieh et al. | 446/330 |
| 2007/0163010 A1 * | 7/2007 | Ishii | D21/484 |
| 2007/0184722 A1 * | 8/2007 | Doherty | 439/638 |
| 2008/0166926 A1 * | 7/2008 | Seymour et al. | 439/701 |
| 2009/0305602 A1 * | 12/2009 | Gaute | 446/91 |

\* cited by examiner

TOY BUILDING BLOCK WITH EMBEDDED INTEGRATED CIRCUIT

This application is a continuation-in-part of U.S. application Ser. No. 12/558,350 filed Sep. 11, 2009, which claims priority from Provisional Application No. 61/096,667, filed Sep. 12, 2008, the entireties of both of which are incorporated herein by reference.

BACKGROUND

This application relates to model and toy ("toy") building bricks or blocks ("blocks") such as those sold by The LEGO™ Group of companies (see, e.g., www.lego.com), and to toy building block sets comprising pluralities of such blocks.

Toy building blocks of the type to which the invention relates are described, e.g., in U.S. Pat. Nos. 3,005,282 and 6,645,033, the entireties of which are incorporated herein by reference. As shown in FIGS. 1-4, such blocks typically comprise hollow box-shaped blocks 10 having tops with outwardly facing surfaces 12 which are provided with primary coupling members in the form of cylindrical projections or studs ("studs") 14. The studs are located at evenly-spaced positions in regular n×m row and column array arrangements, which for embodiments such as the standard rectangular parallelpiped blocks shown (e.g., standard LEGO™ block with length L=3 cm×width W=1.5 cm×height H=1 cm rectangular size format and 2×4 stud arrangement) are so disposed that four studs form the corners of a square. Downwardly opening hollow cavities 16 are defined by inside surfaces 18, 20 of the top and sides of the blocks 10. Located within the cavities 16 are secondary coupling members 22 in the form of cylindrical tubular elements 22 that depend from the top inside surfaces 18 at positions corresponding to centers of the squares whose corners are formed by the studs 14, and which when two blocks 10 are interconnected will fit in between four of the studs 14 (see FIG. 4).

The blocks 10 are typically fabricated using injection molding of thermoplastic material, with the coupling members 14, 22 and insides of the cavities 16 being dimensioned, configured and adapted so that blocks 10 may be removably interconnected by causing the coupling studs 14 of one block 10 to enter the cavity 16 of another block 10, whereby the studs 14 frictionally engage with the inside walls that define the cavity 16 and with the adjacent tubular element 22 centrally in the cavity 16. As described in U.S. Pat. No. 6,645,033, the coupling studs 14 may be substantially cylindrical tubes, and additional flanges or ribs ("ribs") 24, 26 may be provided extending outwardly from the inside surfaces 18 defining the cavities 16 and/or from the tubular elements 22 at points of frictional engagement of those surfaces 18 and elements 22 of one block with the studs 14 of another.

Figure 1:
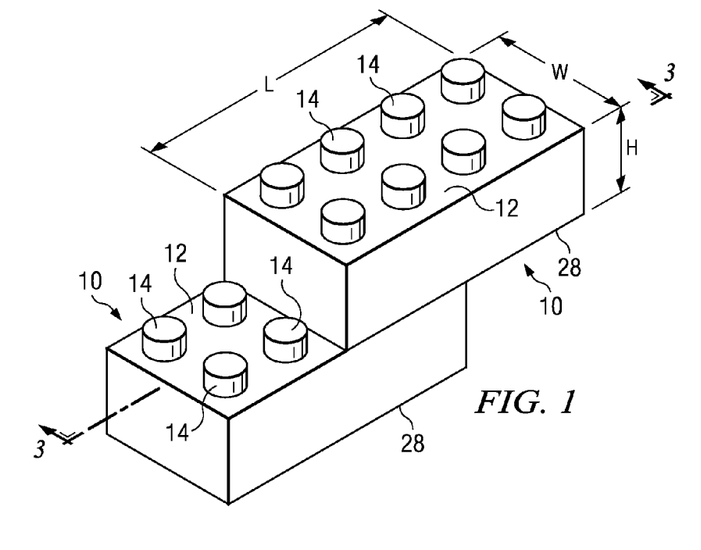
FIGS. 1 and 2 are respective top and bottom perspective views of conventional interlocked toy building blocks of the type to which the invention relates.
Figure 2:
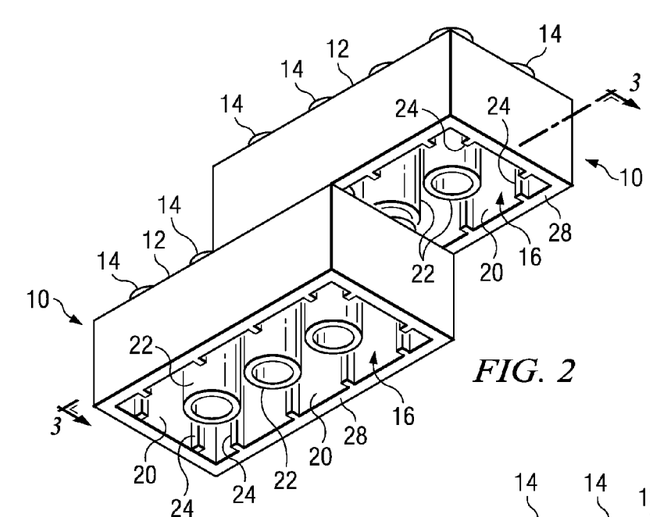
Figure 3:
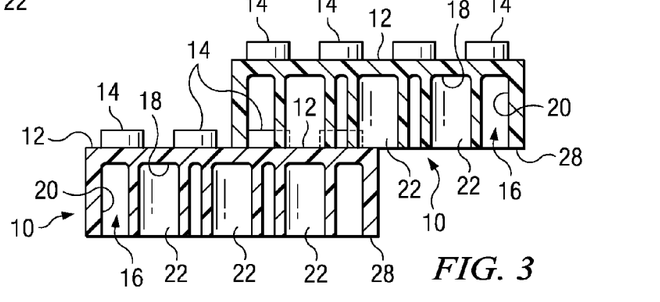
FIG. 3 is a section view taken along the view line 3-3 of FIG. 1 or 2.
Figure 4:
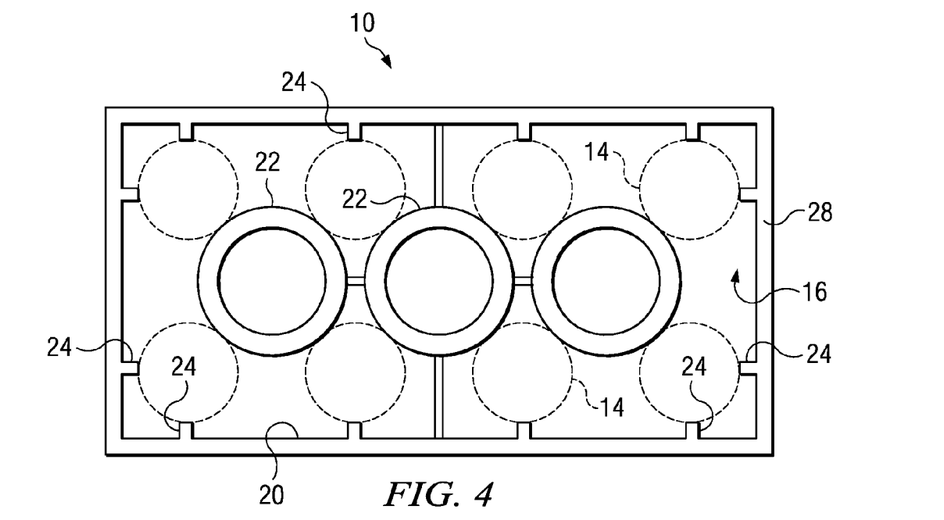
FIG. 4 is a bottom plan view of one of a block shown in FIGS. 1-3.

FIGS. 2 and 4 show elongated ribs 24 extending vertically between the top inside surface 18 and side bottom edges 28 within the cavity 16 of each block 10, at lengthwise or widthwise evenly-spaced intervals along the long and short side inside surfaces 20. For the illustrated embodiment block 10, the relative positioning of sidewall ribs 24, tubular elements 22 and studs 14 is such that there are three points of frictional engagement at respective angularly-spaced intervals about the outer circumference of the studs 14 when adjacent blocks 10 are fitted together (see FIG. 4).

Figure 5:
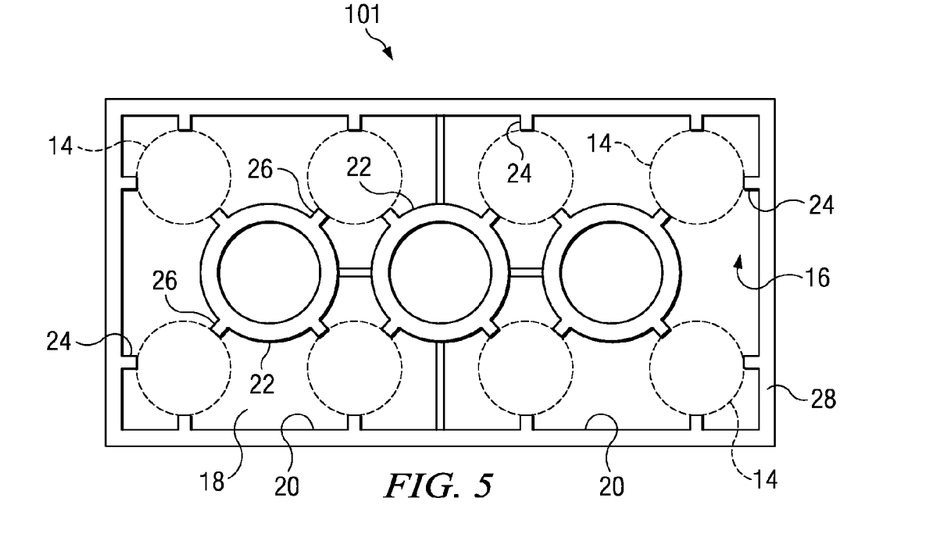
FIG. 5 is a view similar to FIG. 4 of a modified form of the same block.

FIG. 5 shows a modification of block 10 in the form of an otherwise similar block 110 which also has elongated ribs 26 extending vertically between a top inside surface 18 and side bottom edges 28 within a cavity 16, at even angularly-spaced intervals around the outer circumferences of each tubular element 22. For the modified embodiment block 110, the relative positioning of sidewall ribs 24, tubular element ribs 26 and studs 14 is such that three of the ribs 24 and 26 will frictionally engage each stud 14 at respective angularly-spaced intervals about the outer circumference of the stud 14 when adjacent blocks 110 are fitted together. Studs 14 engaged at corners within the cavity 16 will be engaged by two sidewall ribs 24 and one tubular element rib 26, and studs engaged at other locations will be engaged by one sidewall rib 24 and two tubular element ribs 26, as shown.

It is advantageous for all building blocks 10 or 110 of a building block set to be of same standard sizes. As stated in U.S. Pat. No. 6,645,033 at col. 1, lines 36-44, in connection with modular building block sets using blocks described therein, for example, "it is important that all building elements of the building set comply with fixed modular measures which characterize the building set, such as a fixed modularized height, width and length of the body parts of the building elements, as well as a fixed modularized distance between the individual coupling studs, side flange and coupling flanges. This is required to ensure that the building set allows different models to be built in an easy manner."

The incorporation of a discrete electrical component, such as a capacitor, within a cavity of a toy building block is generally described in U.S. Pat. No. 3,346,775, the entirety of which is incorporated herein by reference. There is, however, no disclosure of incorporation within the cavity of a standard building block of more complex electronic devices or systems. A battery building element described in that patent that includes cylindrical coupling members for interconnection with standard sized building blocks is a dedicated purpose building module that has a non-standard, multiple block size which is much larger size than standard building blocks such as the standard blocks 10 or 110 shown in FIGS. 1-5.

U.S. Pat. Nos. 6,547,624 and 6,733,360, the entireties of both of which are incorporated herein by reference, describe other modular building elements that incorporate more complex circuitry in the form of cameras or similar visual image input devices and also include cylindrical coupling members for interconnection with standard toy building blocks of the type described above. However these, too, take the form of non-standard oversized building elements that are dedicated to a specific purpose and cannot readily be interchanged with blocks such as the described blocks 10 and 110.

SUMMARY

In one aspect, principles of the invention are implemented in a standard size modular building block which may be interconnected with similarly configured blocks in toy building block sets, such as available from The LEGO™ Group of companies.

In described embodiments, the blocks may comprise hollow box-shaped structures provided with primary coupling members in the form of cylindrical studs located at evenly-spaced positions in regular arrays on tops of the blocks. Downwardly opening cavities are defined by inside surfaces of tops and sides of the blocks, and the blocks can be interconnected by inserting the studs of one block into the downwardly opening cavity of another block. In some blocks, secondary coupling members in the form of cylindrical tubular elements that depend from the top inside surfaces assist the frictional interengagement of the blocks. The described blocks are typically made of molded thermoplastic material and include one or more integrated circuit chips embedded within the molded structures. Electrical interconnection for the chips is established by leads incorporated within the block structures which electrical connect to like leads of other blocks when the blocks are frictionally interengaged in the usual manner.

Components of more complex electrical systems can be apportioned to different blocks which when interconnected provide the complete system functionality.

Other aspects and features of the invention will become apparent to those skilled in the art to which the invention relates upon reading the detailed description of example embodiment below, with reference to the accompanying drawings.

DETAILED DESCRIPTION OF EXAMPLE EMBODIMENTS

Figure 6:
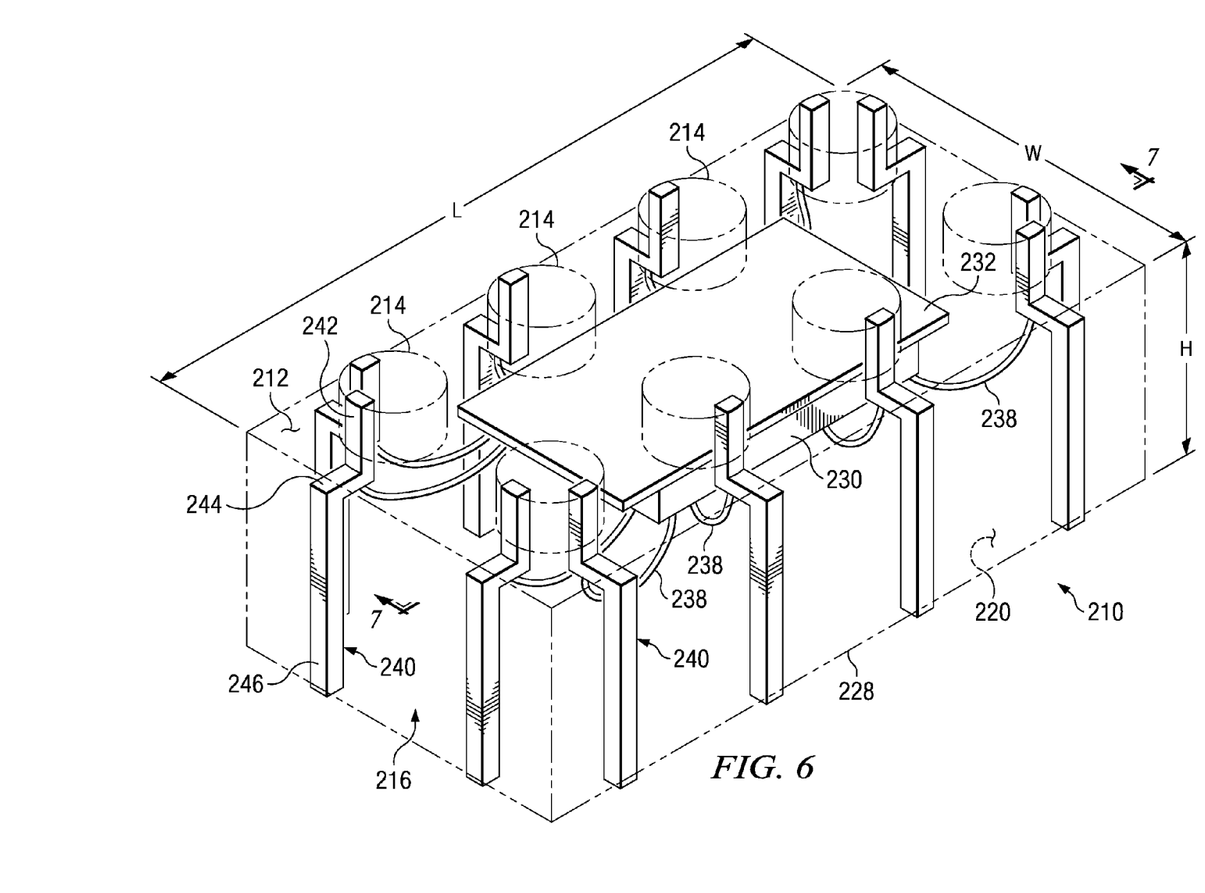
FIG. 6 is a perspective view with parts in phantom, illustrating an embodiment of a block constructed according to principles of the invention.
Figure 7:
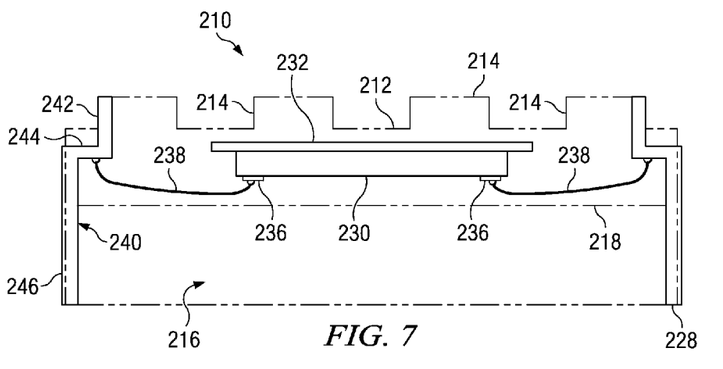
FIG. 7 is a section view taken along the view line 7-7 of the block of FIG. 6.
Figure 8:
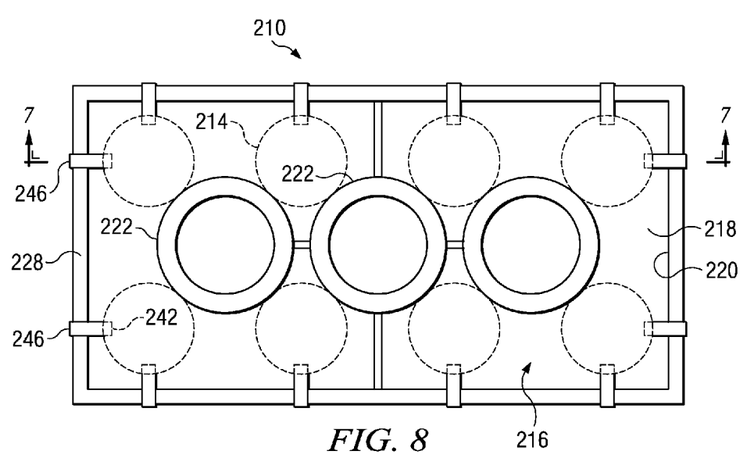
FIG. 8 is a bottom plan view of the block shown in FIGS. 6 and 7.

FIGS. 6-8 illustrate an embodiment of the principles of the invention implemented in a standard size modular building block 210 of the type already described above with reference to FIGS. 1-4. Portions which are common to structure shown in FIGS. 1-4 are shown in phantom in or omitted from FIGS. 6-7 for ease of illustration.

As already mentioned, the block 210 may comprise a hollow box-shaped block having a top with an outwardly facing surface 212 on which are provided a plurality of primary coupling members in the form of cylindrical studs 214. The studs 214 are located at evenly-spaced positions in a regular n×m row and column array. Block 210 may be a standard rectangular parallelpiped block of standard LEGO™ block dimension with studs 214 arranged in a standard LEGO™ block form arrangement (For example, the block 210 may be a rectangular face cubic format open bottom block with length L=3 cm, width W=1.5 cm and height H=1 cm having a 2×4 standard LEGO™ format stud arrangement.) A downwardly opening hollow cavity 216 is defined by inside surfaces 218, 220 of the top and sides of the blocks 10. Located within the cavity 216 are secondary coupling members (shown in FIG. 8) in the form of cylindrical tubular elements 222 that depend from the top inside surface 218 at positions corresponding to centers of squares whose corners are formed by positions of studs 214, and which when two blocks 210 are interconnected will fit in between four of the studs 214, as previously described.

The block 210 may be fabricated using injection molding of thermoplastic material, with the coupling members 214, 222 and insides of the cavity 216 being dimensioned, configured and adapted so that like blocks 210 may be removably interconnected by causing the coupling studs 214 of one block 210 to enter the cavity 216 of another block 210, whereby the studs 214 frictionally engage with the inside walls that define the cavity 216 and with the adjacent tubular element 222 centrally in the cavity 216.

In departure from the structure shown in FIGS. 1-4, an integrated circuit chip 230 is embedded within the material of block 210, between the top outwardly facing surface 212 and the top inwardly facing surface 218. The integrated circuit chip 230 may take any form and be suitable for any one or more functional purposes. In the illustrated embodiment, chip 230 is mounted on a generally planar pad portion 232 of a lead frame 234 (discussed further with reference to FIGS. 9 and 10 below) and has contact pads 236 connected via electrically conductive bond wires 238 to respective electrically conductive elongated fingers or leads ("leads") 240. The illustrated leads 240 include upper portions 242, middle portions 244 and lower portions 246 and are located at positions generally corresponding to the positions of ribs 24 described above with reference to FIGS. 1-4.

The upper portions 242 of the leads 240 are bent generally vertically upward into respective ones of the studs 214 so that conductive material of the leads 240 is formed into the plastic material of the studs 214 with parts exposed at locations on the stud outer circumference corresponding to points of abutment of studs 214 with side inside surfaces 220 when similar blocks 210 are brought into frictional engagement, one above the other. These locations are indicated by dashed lines in FIG. 8 and correspond to the points of engagement of the outer circumference of the studs 14 with the ribs 24 shown for block 10 in FIG. 4. Other parts of the upper portions 242 are embedded within the plastic of the formed studs 214 which also serves as an insulator.

The lower portions 246 of the leads 240 are bent generally vertically downward into alignment with the sidewalls of the block 214 so that conductive material of the leads 240 is formed into the plastic material of the sidewalls with inwardly projecting parts exposed at locations on the inside of the cavity 216 corresponding to points of abutment of the side inside surfaces 220 with the studs 214 when similar blocks 210 are brought into frictional engagement, one above the other. These locations are shown by solid lines in FIG. 8 and correspond to the locations of the ribs 24 for block 10 in FIG. 4. The dimensioning of the lower portions of the leads 240 is chosen so that the parts of the lower portions exposed on the inside of the cavity 216 extend into the cavity 216 by an amount that will provide frictional engagement with the studs 214 that is similar to the frictional engagement provided between the ribs 24 and the studs 14 for the block 10 of FIGS. 1-4. The lower portions 246 are formed into the plastic material of the sidewalls to also have outwardly projecting parts exposed at locations on the outside of the block 210 opposite to the points of abutment of the side inside surfaces 220 with the studs 214. The outwardly projecting parts exposed on the outside of the block 210 serve to provide electrical connection when similar blocks 210 are bought into side-by-side positions through engagement with the same of different other blocks 210, one above the other. The dimensioning of the outwardly projecting parts of the lower portions 214 of leads 240 is chosen so that the exposed parts on the outside of one block 210 will respectively contact corresponding exposed parts on the outside of another block 210 when the two blocks 210 are brought into side-by-side adjacent positions. The lower portions 246 may conveniently be dimensioned to extend vertically for substantially the entire height H of the sidewalls of the block 210, from just below the top upper surface 212 of the block 210 to the bottom of the sides. This positions the leads 240 with the tops of lower portions 246 left unexposed proximate the top upper surface 212 and the bottoms of lower portions 246 extended down into general coplanar alignment with the side bottom edges 228 of the block 210.

The middle portions 244 of the leads 240 extend generally horizontally from the sides to the central region of the top of block 210, embedded within the plastic material in general coplanar alignment with the pad portion 232, and vertically located between the top outwardly facing surface 212 and the top inwardly facing surface 218. The middle portions 244 define steps located intermediate the upper portions 242 and the lower portions 246 that laterally offset the lower portions 246 outwardly relative to the upper portions 242. The middle portions 244 provide landing surfaces for attachment of the lead ends of the bond wires 238 which extend between the contact pads 236 of the chip 230 and the leads 240. In the depicted arrangement, the middle portions 244 provide electrical connectivity between the upper portions 242 and the lower portions 246, thereby enabling electrical communication between successive corresponding parts of multiple like-configured blocks 210 placed in series, one above the other.

The example block 210 is shown in FIGS. 6-8 having ten leads 240 with lower portions 246 generally positioned at locations corresponding to those of the ribs 24 shown for block 10 in FIG. 4. The lower portions 246 are dimensioned to protrude inwardly from the side inside surfaces 220 so that they can serve the same function with respect to frictionally engagement of like blocks 210 as the ribs 24 serve for like blocks 10. Accordingly, not only can blocks 210 be frictionally interengaged with like blocks 210 which include leads 240, but blocks 210 can also be frictionally interengaged with other blocks such as blocks 10 which do not include leads 240, nor incorporate an integrated circuit chip 230. Moreover, blocks 210 can also be frictionally interengaged with earlier designs of similar blocks ("legacy blocks") which do not include ribs 24 and/or do not include tubular elements 22 or 222. It will be appreciated that the leads 240 may take various forms other than the ones illustrated, and that their number and positioning can be varied to accommodate different needs and preferences.

Figure 9:
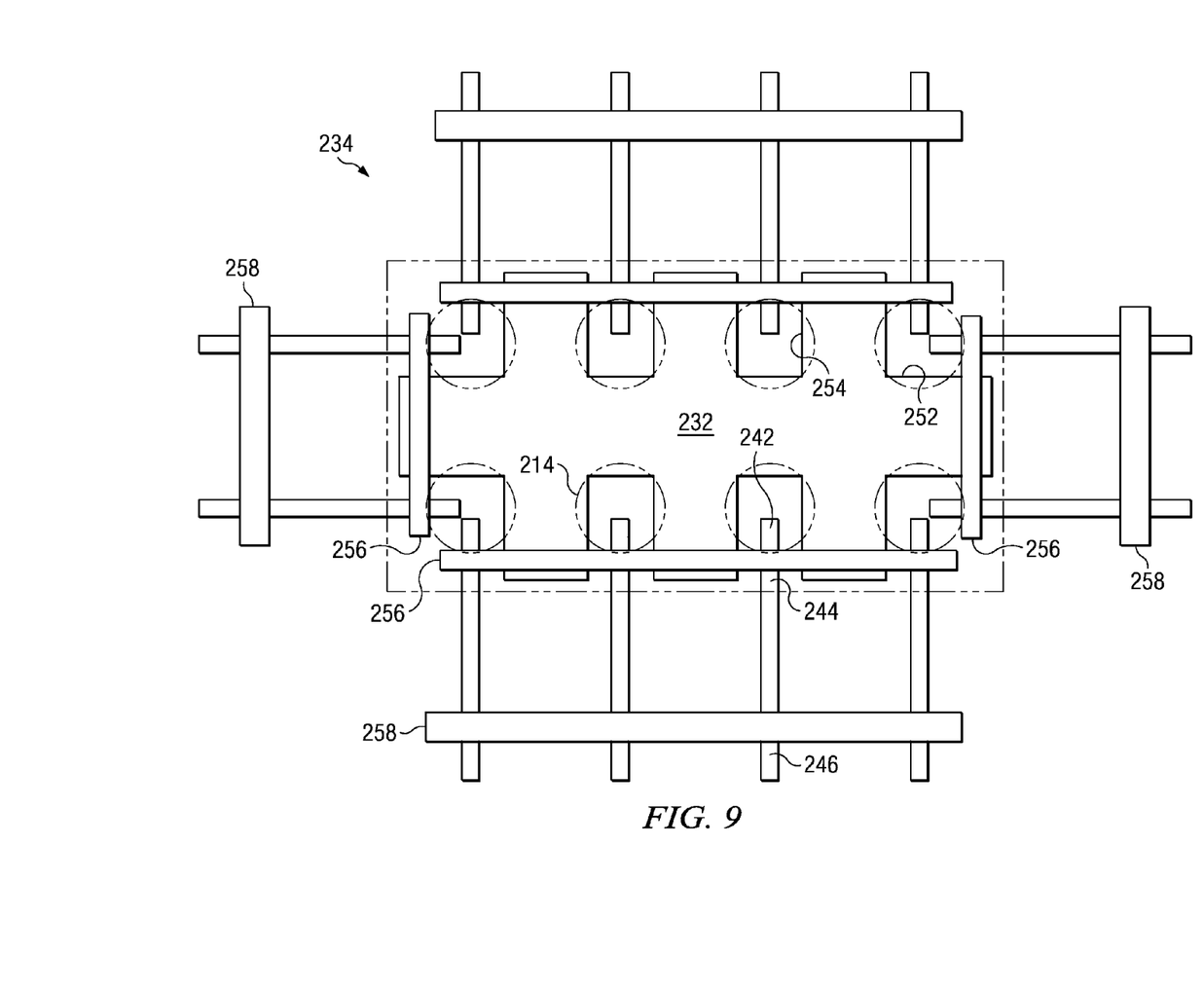
FIG. 9 illustrates an example lead frame usable in the construction of the block of FIGS. 6-8.
Figure 10:
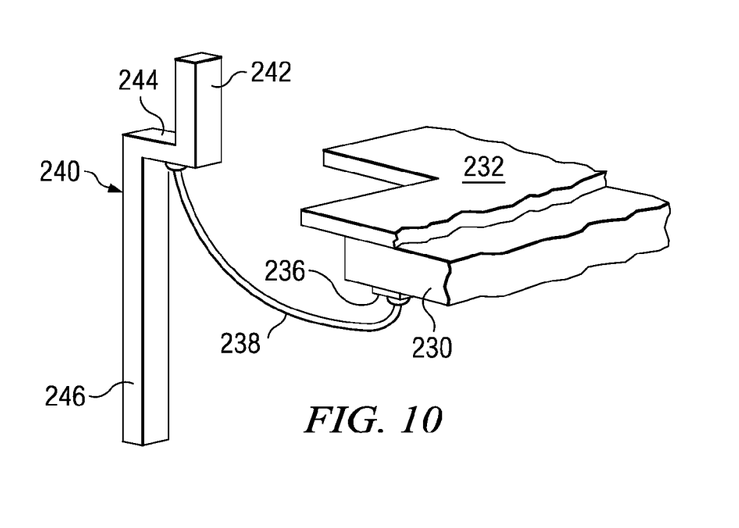
FIG. 10 is a fragmentary enlarged perspective view of a portion of the lead frame of FIG. 9.

An example lead frame 234 usable in the fabrication of a block 210 such as described above is shown in FIGS. 9 and 10. The lead frame 234 may be stamped or otherwise formed into an initial generally planar configuration as shown in FIG. 9. This configuration includes a pad portion 232 having a generally rectangular perimeter including corner and central edge cutouts 252, 254 roughly spaced to correspond to horizontal locations of the studs 214 of the block 210 (shown superimposed in phantom in FIG. 9) into which the lead frame 234 will be embedded. The lead frame 234 also includes elongated leads 240 extending from the pad portion 232. The illustrated example shows ten leads 240: two extending outward in longitudinal alignment with the length of and from widthwise spaced positions at each width edge of the pad portion 232, and four extending outward in lateral alignment with the width of and from lengthwise spaced positions at each length edge of the pad portion 232. The inner ends of the leads 240 shown in FIG. 9 are the unbent upper portions 242. They are free ends located within the cutouts 252, 254 unattached to the pad portion 232, which enables them to be readily bent upwards into the configuration shown in FIG. 10. The middle of the leads 240 shown in FIG. 9 are the middle portions 244 which will not be bent, and to which the bond wires 238 will be attached as shown in FIG. 10. For ease of fabrication, the middle portions 244 extending from the same pad portion edges can be at least temporarily secured in fixed positions relative to one another and to remaining marginal parts of the pad portion 236 by supporting tape or film strips 256. The outer ends of the leads 240 shown in FIG. 9 are the unbent lower portions 246 which are spaced away from the perimeter of the pad portion 232, and can be readily bent downwards into the configuration shown in FIG. 10. For ease of fabrication, the lower portions 246 extending from the same pad portion edges can be at least temporarily secured in fixed positions relative to one another by supporting tape or film strips 258.

Although steps may be performed in another order, in one example of the assembly of the lead frame 234, the upper portions 242 and lower portions 246 of the leads 240 are bent into their configurations shown in FIG. 10 and then the integrated circuit chip 230 is attached to the pad portion 232. Thereafter, the bond wires 238 are attached from the contact pads 236 to the middle portions 244 of the bent leads 240 using a wire bonder or other suitable attachment mechanism. The lead frame 234 is then inserted into the mold for injection molding of the thermoplastic into the standard studded hollow box-shaped block configuration with the lead frame 234 embedded in the plastic. The mold is modified (mold cavity enlarged) to accommodate the part of the lead lower portions 246 that will protrude out from the previously uniformly planar outer surface of the sides of the body 210 at the locations opposite the corresponding inner protuberances of the of the prior ribs 24. The part of the lead lower portions 246 that will protrude into the cavity 216 may be generally accommodated by the part of the mold previously used to form the ribs 24. The bent lead frame 234 with the chip 230 and bond wires 238 attached can be placed in the mold cavity with the bottoms of lower portions 246 resting in general coplanar alignment with the parts of the mold cavity that will shape the side bottom edges 228 of the block 210. The lead upper portions 242 are placed to extend upwardly into the part of the mold cavity that will shape the studs 214 of the block 210, and to contact the side of the cavity at locations and for the dimensions of the parts of the upper portions 242 that will be exposed in the molded block 210. Alternative and additional arrangements and procedures may be implemented prior to or during the molding process depending on individual needs and preferences.

The supporting strips 256 may be made of a material which can be dissolved or otherwise readily removed once their utility for temporarily fixing the relative positions of the leads 240 is no longer needed. In such case, the permanent fixing of the elements of lead frame 234 within the block 210 will be done solely by the cured injected thermoplastic material. Alternatively, the supporting strips 256 can be made of a material that is compatible with the injected thermoplastic material, and the strips 256 can be left in place and embedded within and as a part of the molded end structure of the block 210.

In the illustrated example, the chip 230 is attached to the underside of the pad portion 232 as viewed in FIGS. 6, 7 and 10. This enables the ready attachment of bond wires 238 to the undersides of the lead middle portions 244 and enables the wires to be readily completely accommodated within the dimension of the block 210 between the top outer surface 212 and top inside surface 218. The mold can be modified as needed to accommodate different dimensions of the chip 230 and the mode of attachment to the leads 240 by, for example, lowering the height of the top inside surface 218 to increase its spacing from the top outer surface 212 (and reduce the open volume of cavity 216) without changing the overall external dimensions of the block 210. Placing the chip 230 and/or pad portion 232 in coplanar alignment proximate the top outer surface 212 or top inside surface 218 may be advantageous for heat dissipation during operation of the embedded chip.

Figure 11:
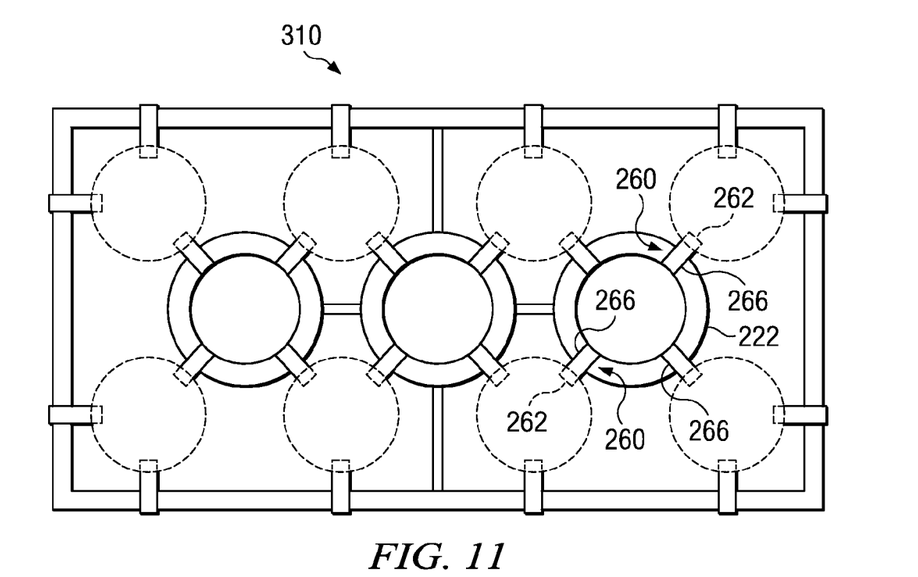
FIG. 11 is a view, similar to the view of FIG. 8, of an example modification of the block of FIGS. 6-8.

FIG. 11 shows a modification of the example block 210 of FIGS. 6-10 in the form of a block 310 which has additional leads 260 incorporated into the previously described structure. The leads 260 have upper portions 262 which, similarly to the upper portions 242 of the leads 240, are bent generally vertically upward into respective ones of the studs 214 so that conductive material of the leads 260 is formed into the plastic material of the studs 214 with parts exposed at locations on the stud outer circumference corresponding to points of abutment of studs 214 with tubular elements 222 when similar blocks 310 are brought into frictional engagement, one above the other. These locations are indicated by dashed lines in FIG. 11 and correspond to the points of engagement of the outer circumference of the studs 14 with the tubular elements 22 shown for block 10 in FIG. 4. Other parts of the upper portions 262 are embedded within the plastic of the formed studs 214 which also serves as an insulator.

The leads 260 further have lower portions 266 which, similarly to the lower portions 246 of the leads 240, are bent generally vertically downward into alignment with the circumferential walls of the tubular elements 222 so that conductive material of the leads 260 is formed into the plastic material of the walls of the tubular elements 222 with outwardly projecting parts exposed inside cavity 216 on the outside of the tubular elements 222 at locations corresponding to points of abutment of the tubular elements 222 with the studs 214 when similar blocks 310 are brought into frictional engagement, one above the other. These locations are shown by solid lines in FIG. 11 and correspond to the locations of the ribs 26 for block 10 in FIG. 4. The dimensioning of the lower portions 266 of the leads 260 is chosen so that the parts of the lower portions 266 exposed on the inside of the cavity 216 extend into the cavity 216 by an amount that will provide frictional engagement with the studs 214 that is similar to the frictional engagement provided between the ribs 26 and the studs 14 for the block 10 of FIGS. 1-4. The lower portions 266 may conveniently be dimensioned to extend vertically for substantially the entire longitudinal dimension (height) of the tubular elements 222 of the block 310, from just the top inside surface 218 of the block 310 to the bottom of the tubular elements 222. This positions the leads 260 with the tops of lower portions 266 left unexposed proximate the top inside surface 218 and the bottoms of lower portions 266 extended down into general coplanar alignment with the side bottom edges 228 of the block 310.

The leads 260 have middle portions which, similarly to the middle portions 244 of the leads 240, are embedded within the molded plastic and define steps located intermediate the upper portions 262 and the lower portions 266 and laterally offset the lower portions 266 outwardly relative to the upper portions 262. Like the middle portions 244, the middle portions of leads 260 provide landing surfaces for attachment of lead ends of bond wires which extend between contact pads 236 of the chip 230 and the leads 260. Like the middle portions 244, the middle portions of leads 260 provide electrical connectivity between the upper portions 262 and the lower portions 266, thereby enabling electrical communication between successive corresponding parts of multiple like-configured blocks 310 placed in series, one above the other.

Figure 12:
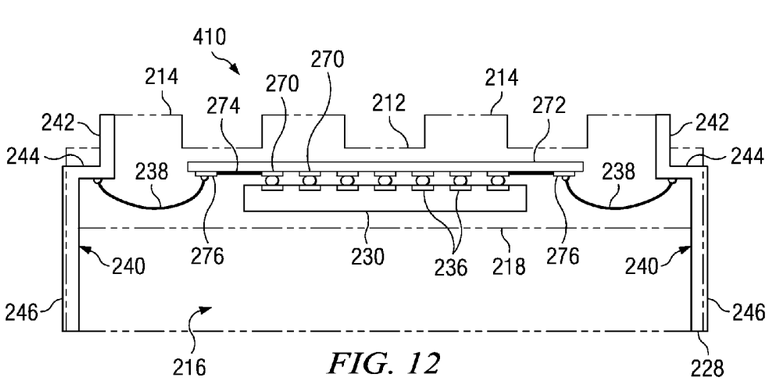
FIGS. 12-14 are section views, similar to the view of FIG. 7, of example modifications of the block of FIGS. 6-8.
Figure 13:
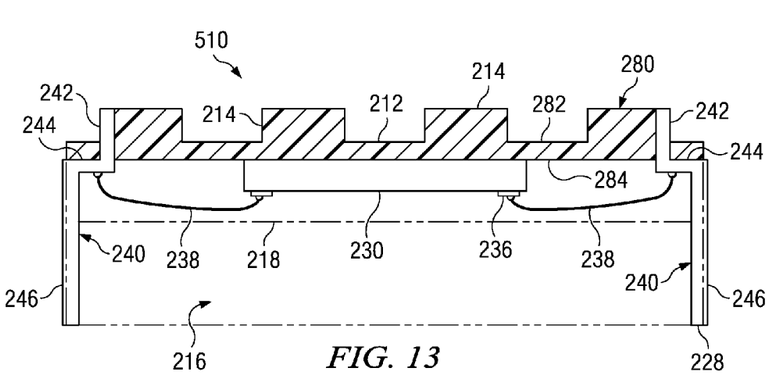
Figure 14:
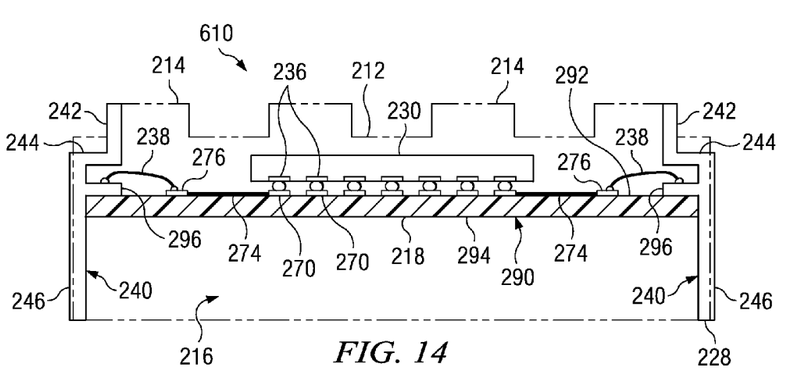

FIGS. 12-14 show examples of modifications for embedding an integrated circuit within a toy building block of the type described.

In FIG. 12, a block 410 has an integrated circuit chip 230 with contact pads 236 located on an underside thereof that are bonded by means of solder ball connections to corresponding contact pads 270 located on an interposer 272. The interposer 272 serves as a chip pad to receive the chip 230. The interposer 272 includes conductive traces 274 patterned to provide electrical connectivity between the solder ball connection contact pads 270 and respective other contact pads 276 conveniently located relative to leads 240 which may take the form of the leads 240 previously described. The contact pads 276 serve as attachment points for bonding wires 238 which provide electrical connections between the interposer contact pads 276 and landing points on the middle portions 244 of the leads 240. The combination of the integrated chip 230 and interposer 272 can be embedded within the material of block 410, between the top outwardly facing surface 212 and the top inwardly facing surface 218, in a similar manner to that previously described for embedding the integrated circuit chip 230 and pad portion 232 of lead frame 234 into the material of block 210 shown in FIG. 7. The upper portions 242 of leads 240 are embedded within the plastic material of studs 214 with parts exposed at points of abutment of the studs 214 with side inside surfaces when similar blocks 410 are brought into frictional engagement, one above the other. The lower portions 246 of leads 240 are embedded within the plastic material of the sidewalls with inwardly projecting parts exposed at locations on the inside of cavity 216 corresponding to points of abutment of the side inside surfaces with the studs 214 when similar blocks 410 are brought into frictional engagement, one above the other. The lower portions 246 also have outwardly projecting parts exposed at corresponding locations on outer surfaces of the sidewalls to provide contact (and, thus, electrical interconnection) with like parts on the outer surfaces of corresponding leads 240 when similar blocks 410 are brought into side-by-side adjacent positions, such as, for example, when the cavities 216 of two blocks 410 are frictionally engaged with respective different immediately adjacent side-by-side arrays of underlying similar blocks 410. It will be appreciated that blocks 410 may, of course, be also frictionally interengaged with blocks such as previously described blocks 210, 310 or other correspondingly shaped modern or legacy blocks.

FIGS. 13 and 14 show modifications wherein an integrated circuit chip 230 is attached to a structure in the form of a preformed element which may predefine a portion of the block structure.

For example, in FIG. 13, the preformed element takes the form of a preformed lid 280 which includes an upper surface 282 and an undersurface 284. The upper surface 282 functions as the top outwardly facing surface 212 of the block, and includes the plurality of cylindrical studs 214. The undersurface 284 serves as a mounting surface for attachment of the chip 230 and may receive the chip in any suitable manner. The illustrated arrangement shows the undersurface 284 functioning similar to the pad portion 232 of lead frame 234 shown in FIG. 7, with the underside of the chip 232 attached to the undersurface 284 with bond wires 238 establishing electrical connectivity between chip contact pads 236 and landing sites on the middle portions 244 of leads 240, the top portions 242 of which can be pre-attached to the stud portions of the preformed lid 280 (for example, by being embedded therein during molding of the preformed element). The preformed lid 280, together with integrated circuit chip 230, bond wires 238 and leads 240 already attached thereto, can be inserted within the mold cavity for molding the remaining portions of a block 510. For the illustrated example, the molding of the remaining portions is conducted so that the lid 280 will be integrally incorporated with the rest of the structure of block 510, with the undersurface 284, integrated circuit chip 230, bond wires 238 embedded between the preformed lid upper surface 282 and a new molded block top inwardly facing surface 218. The resulting end block 510 can in all other respects be given the same general configuration and dimensioning as any of the blocks 210, 310 or 410 previously discussed, so that it can be frictionally engaged with other blocks in the same previously discussed manner. It will be appreciated that, while the example lid 280 shown in FIG. 13 has the profile of a complete top of a block 510, the preformed element can be formed to define just a portion of the top (for example, a central chip attach portion only, or an interior portion only that does not define any part of the end block top outwardly facing surface 212).

Another example of a preformed element is shown in FIG. 14. In this case, the preformed element takes the form of a cavity partition insert 290 which includes an upper surface 292 and an undersurface 294 and defines an upper boundary of a cavity 216 of a block 610. The preformed cavity partition insert 290 functions in similar manner to the interposer 272 shown in FIG. 12. The upper surface 292 functions as a mounting surface for attachment of the chip 230 by solder ball connections established between contact pads 236 located on the chip 230 and corresponding contact pads 270 located on the partition insert 290. The upper surface 292 includes conductive traces 274 patterned to provide electrical connectivity between the solder ball connection contact pads 270 and respective other contact pads 276 conveniently located relative to leads 240 which perform the same function as the leads 240 previously described. The contact pads 276 serve as attachment points for bonding wires 238 which provide electrical connections between the insert contact pads 276 and landing points on the middle portions 244 of the leads 240. For ease of bonding to the middle portions 244, the configurations of the middle portions may be modified from those previously discussed, to include inwardly directed free ends 296 which are laterally offset (in a direction out of the page of FIG. 14) from the parts of middle portions 244 that continue into upper portions 246. The inclusion of such free ends 296 provides an accessible landing site for a bonder for attachment of bonding wires 238 to the leads 240 from above. The undersurface 294 defines the top inwardly facing surface 218 of the block. Incorporation of the preformed element 290 into the end structure of block 610 can proceed similarly to the described incorporation of preformed element 280 into block 510. The resulting end block 610 can be given the same general configuration and dimensioning as any of the blocks 210, 310, 410 or 510 previously discussed, thereby enabling frictional engagement with other same or similarly shaped blocks in the manner previously discussed. As for the preformed lid element 280, the preformed cavity partition insert 290 can be configured to provide all, part or none of the end block top inwardly facing surface 218).

In some example implementations, multiple chips 230 may be mounted on a common preformed insert 280 or 290 or lead frame structure for incorporation into a common block of the type described. Additionally, peripheral components and connections, such as those typically included together on a modular or similar small format printed circuit board, may also be included in the same block. In other embodiments, related multiple components can be apportioned to different blocks with leads 240 serving to provide, for example, data and/or power intercommunications among the different blocks including subparts of a same system.

Figure 15:
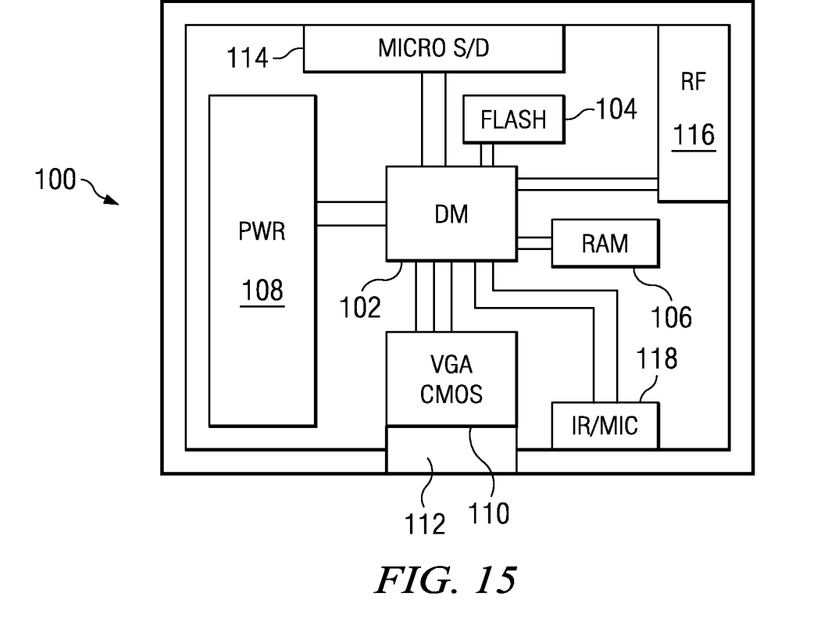
FIGS. 15 and 16 illustrate an example implementation of an electrical system in accordance with principles of the invention.
Figure 16:
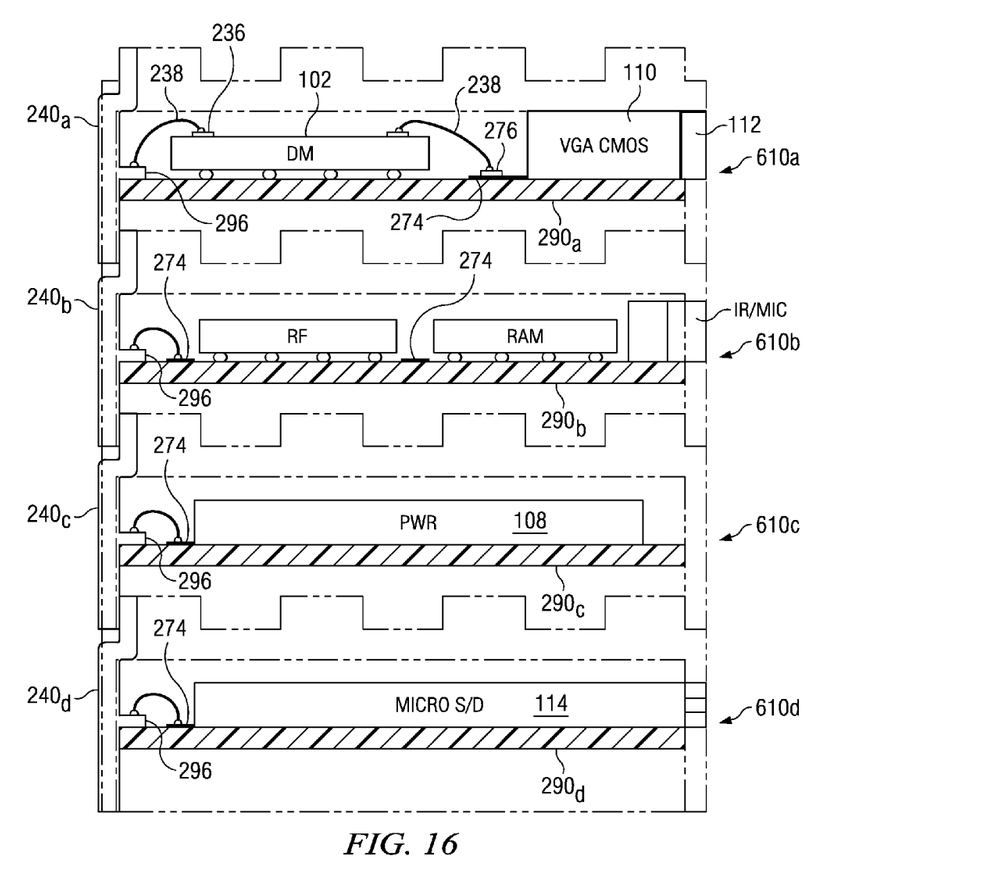

FIGS. 15 and 16 illustrate an example implementation wherein electronics and peripherals of an audio-visual system 100 are incorporated into standard size modular building blocks such as described previously herein. The components for such a system may, for example, include those shown and described at www.leopardboard.org for a small form factor system which includes a TMS320DM355, TMS320DM365 or similar TMS320DM3xx processor board and VGA camera board to provide VGA resolution video capture. As shown in FIG. 15, basic components for such a system include a low power DM3xx processor chip (DM) 102, flash memory (FLASH) 104, random access memory (RAM) 106, a battery or other power module (PWR) 108, a VGA CMOS camera module (VGA CMOS) 110 having an image capture aperture 112 and other components such as resistors & capacitors. The processor chip may be of a type such as, for example, available commercially from Texas Instruments. The camera module may be of a type such as, for example, available commercially from OmniVision or Aptina Imaging. Other components, such as a micro S/D chip and carrier (MICRO S/D) 114, an RF wireless communication module (RF) 116, or an infrared transceiver/audio microphone element (IR/MIC) 118, may be optionally included.

As shown in FIG. 16, the components of system 100 may be mounted on one or more preformed elements 290 which include conductive traces 274 or other conductive wiring and function as printed circuit board substrates. FIG. 16 shows just one example for apportioning the components of system 100 among multiple interconnectable blocks 610. In the illustrated apportionment, the camera module (VGA CMOS) 110, processor chip (DM) 102 and flash memory (FLASH) 104 are mounted on a first preformed insert 290a and embedded within a first block 610a. The random access memory (RAM) 106, optional RF wireless communication module (RF) 116 and infrared transceiver/audio microphone element (IR/MIC) 118 are mounted on a second preformed insert 290b and embedded within a second block 610b. The battery or other power module (PWR) 108, which may be a rechargeable energy source, is mounted on a third preformed insert 290c and embedded within a third block 610c. The micro S/D chip and carrier (MICRO S/D) 114 is mounted on a fourth preformed insert 290d and embedded within a fourth block 610d. The fabrication of the blocks 610a, b, c, d can be done similarly to the fabrication of the previously described blocks, except with provision made for porting for visual, audio and card insert communication through a sidewall of the respective block for components such as the camera module (VGA CMOS) 110, the infrared transceiver/audio microphone element (IR/MIC) 118 and the micro S/D chip and carrier (MICRO S/D) 114. Such communication can, for example, be accomplished by creating an opening or window during molding or making an opening or window following molding.

For simplicity of illustration, FIG. 16 shows just one lead 240a, b, c, d for each block 610 a, b, c, d and it will be appreciated that additional leads 240 will also be provided in each block. When blocks 610a, b, c, d are interconnected in the arrangement shown, the leads 240a, b, c, d interconnect to provide electrical communication among the blocks. Lead assignments are made so that data lines connect for communication of data between data lines and power lines connect for communication of power to power lines. Assignments are preferably made so that the same electrical connectivity is achieved irrespective of the order in which the blocks 610*a, b, c, d* are interconnected, and irrespective of whether the blocks are connected one above the other or side by side. The number of leads 240 used in particular block structures can be increased and their configurations and routing changed to meet individual needs and preferences. Moreover, interconnector blocks can be formed that contain leads 240 but no integrated circuit chips 230, so that modules such as blocks 610*a, b, c, d* shown in FIG. 16 can still be electrically communicated in non-adjacent locations so that placement flexibility is not restricted.

Those skilled in the art to which the invention relates will appreciate that many other embodiments and modifications are possible within the scope of the disclosure and the invention claimed as supported thereby.

What is claimed is:

1. A toy building block, comprising:
   a hollow box-shaped structure made of molded thermoplastic material, including a top and sides each having outwardly and inwardly facing surfaces, primary coupling members in the form of cylindrical studs located at evenly-spaced positions in a regular array on the outwardly facing surface of the top, and a downwardly opening cavity defined by the inwardly facing surfaces of the top and sides; the studs and cavity being relatively configured and dimensioned so that the block may be frictionally engaged with another like block by inserting the studs of one of the blocks into the cavity of the other;
   one or more integrated circuit chips embedded within the molded structure and completely contained within the thermoplastic material; and
   leads incorporated with the molded structure, the leads coupled to the one or more integrated circuit chips and dimensioned, configured and positioned so that when the block is frictionally engaged with the another like block electrical connection of the leads of one of the blocks will be established with the leads of the other.

2. The toy building block of claim 1, wherein the leads are dimensioned, configured and positioned so that leads exposed on studs of the one block will frictionally engage with leads exposed in the cavity studs of the another block.

3. The toy building block of claim 2, wherein the leads are configured to allow at least two separate electrical connections to a stud of another building block.

4. The toy building block of claim 1, further comprising electrical bond wires connecting contact pads of the one or more integrated circuit chips to the leads.

5. The toy building block of claim 4, wherein the leads are leads of a lead frame; and at least one of the one or more integrated circuit chips is mounted on a pad portion of the lead frame.

6. The toy building block of claim 5, wherein the one of more integrated circuit chips are completely contained between the outwardly and inwardly facing surfaces of the top.

7. The toy building block of claim 6, wherein the leads are located to generally correspond to positions of elongated ribs extending within the cavity between the inwardly facing surface of the top and bottom edges of the sides at spaced intervals along the inwardly facing surfaces of the sides.

8. The toy building block of claim 7, wherein upper portions of the leads are bent generally vertically upward into respective ones of the studs.

9. The toy building block of claim 8, wherein the upper portions of the leads are formed so that conductive material of the leads is formed into the thermoplastic material of the studs, with parts of the conductive material exposed at locations on the outer circumferences of the studs.

10. The toy building block of claim 9, wherein the locations of parts exposed on the outer circumferences correspond to points of abutment of studs with side inside surfaces when similar blocks are brought together in frictional engagement.

* * * * *